(12) United States Patent
Cowles et al.

(10) Patent No.: US 6,552,596 B2
(45) Date of Patent: Apr. 22, 2003

(54) CURRENT SAVING MODE FOR INPUT BUFFERS

(75) Inventors: Timothy B. Cowles, Boise, ID (US); Victor Wong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/927,587

(22) Filed: Aug. 10, 2001

(65) Prior Publication Data

US 2003/0030476 A1 Feb. 13, 2003

(51) Int. Cl.[7] .................................................. H03K 3/01
(52) U.S. Cl. ........................................ 327/318; 327/534
(58) Field of Search ................................. 327/108, 318, 327/109, 319, 110, 333, 111, 112, 530, 534, 535, 537

(56) References Cited

U.S. PATENT DOCUMENTS

| | | | | |
|---|---|---|---|---|
| 5,051,625 A | * | 9/1991 | Ikeda et al. .................... 326/27 |
| 5,359,243 A | * | 10/1994 | Norman ....................... 326/121 |
| 5,563,839 A | | 10/1996 | Herdt et al. .................. 365/227 |
| 5,583,457 A | * | 12/1996 | Horiguchi et al. ........... 326/121 |
| 5,614,847 A | * | 3/1997 | Kawahara et al. ........... 326/121 |
| 5,801,578 A | * | 9/1998 | Bereza ........................ 327/157 |
| 5,864,702 A | | 1/1999 | Walsh et al. ................. 395/750 |
| 5,880,623 A | * | 3/1999 | Levinson ....................... 326/33 |
| 6,049,245 A | * | 4/2000 | Son et al. ...................... 326/17 |
| 6,058,063 A | | 5/2000 | Jang ............................ 365/227 |
| 6,380,798 B1 | * | 4/2002 | Mizuno et al. .............. 327/391 |

* cited by examiner

*Primary Examiner*—Jeffrey Zweizig
(74) *Attorney, Agent, or Firm*—Schwegman, Lundberg, Woessner & Kluth, P.A.

(57) ABSTRACT

An input buffer receives an external input signal during an active mode and a low-power mode. The input buffer includes a switching system to switch the input buffer between multiple conductive paths such that current consumed by the input buffer during the low-power mode is substantially less than current consumed by the buffer during the active mode.

74 Claims, 8 Drawing Sheets

CURRENT SAVING MODE FOR INPUT BUFFERS

TECHNICAL FIELD OF THE INVENTION

The present invention relates to integrated circuits and in particular to an input buffer for digital logic circuits.

BACKGROUND OF THE INVENTION

Most digital integrated circuits have input buffers to receive external input signals. Some input buffers are used to receive input signals that indicate operating modes of the integrated circuits. For example, some memory devices such as dynamic random access memory (DRAM) devices have input buffers to receive an external clock enable signal that indicates the operating modes of the DRAM device such as an active mode and a low-power mode. The low-power mode of a DRAM device is sometime referred to as the standby mode or precharge power-down mode. For example, in a conventional DRAM device, a read or a write operation is normally performed in the active mode and a self-refresh operation is normally be performed in the low-power mode.

Typically, a differential input buffer of an integrated circuit or a DRAM device consumes the same amount of current in both active and low-power modes. As the current consumption requirement is reduced for new generation of integrated circuits and DRAM devices, reducing current consumption of conventional differential input buffers may be necessary.

For these and other reasons stated below, and which will become apparent to those skilled in the art upon reading and understanding the present specification, there is a need for an improved input buffer.

SUMMARY OF THE INVENTION

The present invention includes an input buffer which consumes less current during a low-power mode than during an active mode.

In one aspect, the input buffer includes an input stage to receive an input signal and a reference signal to produce an output signal. An output stage connects to the input stage to receive and drive the output signal. The input buffer further includes a switching system to connect the input stage to a supply voltage and ground via a first conductive path during an active mode. During a low-power or standby mode, the switching system connects the input stage to the supply voltage and ground via a second conductive path, in which an active resistance of the second conductive path is substantially greater than an active resistance of the first conductive path.

In another aspect, a method of reducing current in a buffer in a low-power mode is described. The method includes receiving a reference signal and an input signal at inputs of a differential amplifier. The method further includes varying a resistance of a conductive path that connects the amplifier to a supply voltage and ground between an active mode and a low-power mode.

DETAILED DESCRIPTION OF THE INVENTION

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Figure 1:
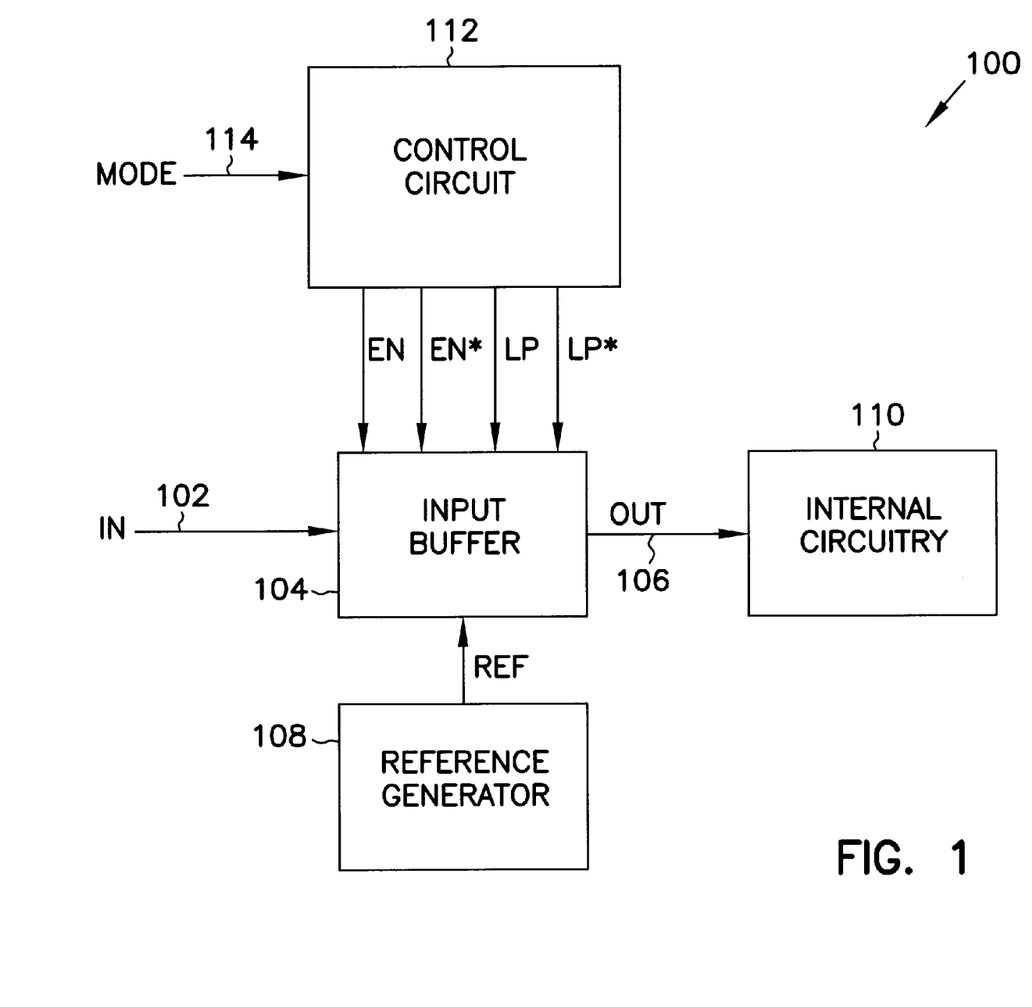
FIG. 1 is an integrated circuit including one embodiment of the invention.

FIG. 1 is a schematic diagram of an integrated circuit 100 according to one embodiment of the invention. Integrated circuit 100 includes an input 102 to receive an external input signal IN. The input signal IN is received by an input buffer 104. Input buffer 104 generates an output signal OUT at an output node 106 based on a relationship between the input signal IN and a reference signal REF. The REF signal is generated by a reference generator 108. In one embodiment, reference generator 108 is an internal circuit of integrated circuit 100. In another embodiment, reference generator 108 is part of another integrated circuit external to integrated circuit 100. The output signal OUT is provided to an internal circuitry 110 for further processing.

Integrated circuit 100 also includes a control circuit 112 to provide control signals EN, EN*, LP, and LP* in response to a mode signal MODE one line 114. These control signals are activated in different operating modes of integrated circuit 100 based on the states of the MODE signal. In one embodiment, the states of the MODE signal can be determined by decoding the states of internal signals of integrated circuit 100. In another embodiment, the states of the MODE signal can be provided by an external integrated circuit such as a controller or a processor. For example, in one state of the MODE signal, the operating mode such as the active mode of integrated circuit 100 is determined, in which the EN and EN* signals are activated and the LP and LP* signal are not activated. In another state of the MODE signal, the operating mode such as the low-power mode is determined, in which the LP and LP* signals are activated and the EN and EN* signal are not activated.

According to the teaching of the invention, input buffer 104 is constructed such that a current drawn by input buffer 104 in one operating mode is not the same as a current drawn by input buffer 104 in another operating mode. For example, in an active mode, input buffer 104 draws a certain amount of current. However, in a low-power mode, in buffer 104 draws substantially less current as compared to the current in the active mode. The low-power mode is also referred to as a standby mode or prechange power-down mode in which integrated circuit 100 is inactive.

Figure 2:
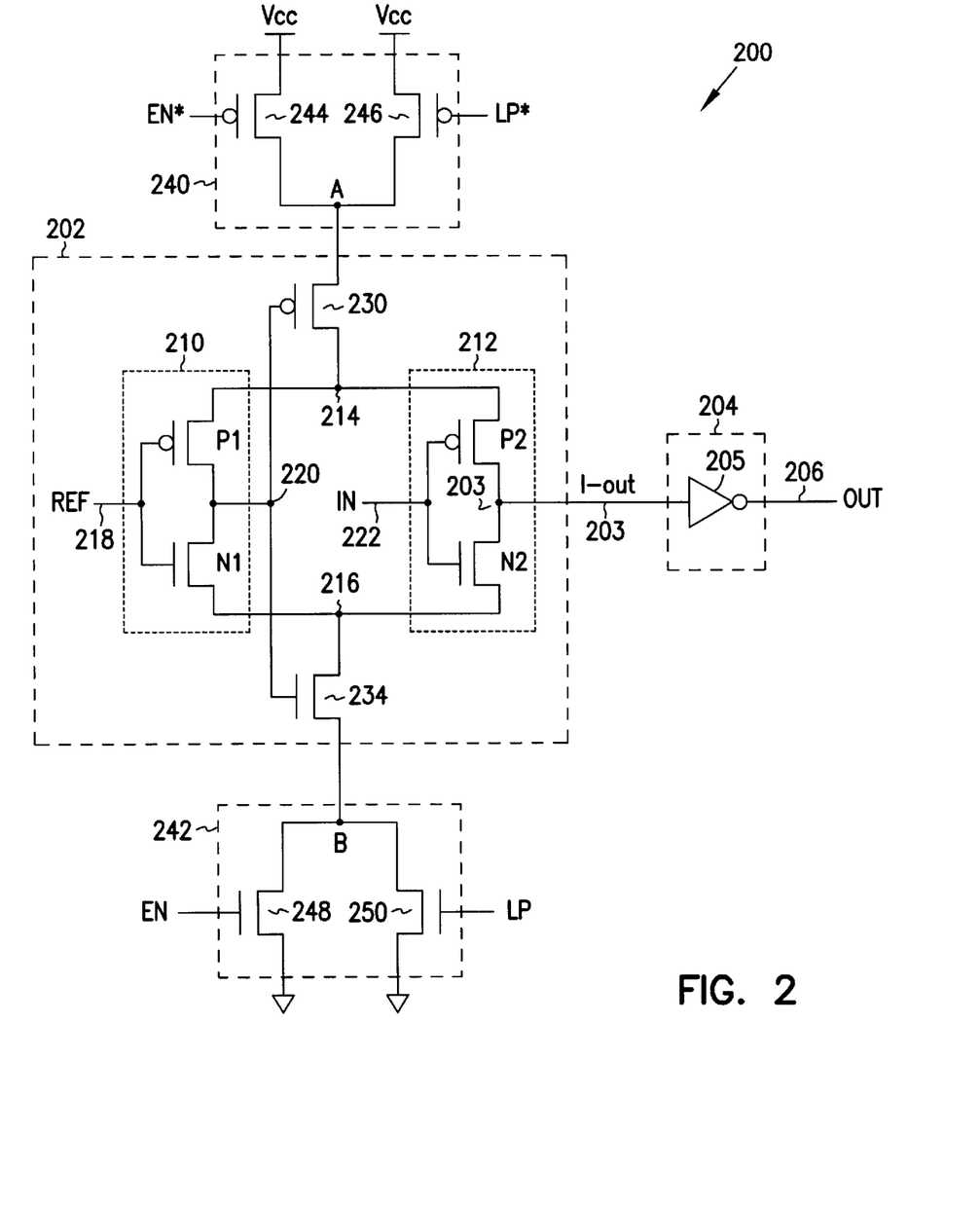
FIG. 2 is a schematic diagram of an input buffer according to one embodiment of the invention.

FIG. 2 is a block diagram of an input buffer 200 according to one embodiment of the invention. Input buffer 200 is represented as input buffer 104 in FIG. 1. Input buffer 200 includes an input stage 202 connected to an output stage 204 at node 203. Input stage 202 input includes a first CMOS transistor pair 210 and a second CMOS transistor pair 212 connected in parallel at nodes 214 and 216. Each of the CMOS transistor pairs 210 and 212 includes p-channel transistor, indicated by P1 and P2, and an n-channel transistor, indicated by N1 and N2. CMOS transistor pair 210 receives a reference signal REF at node 218 and a produces an reference output signal REF-out at node 220. CMOS transistor pair 212 receives an input signal IN at node 222 and a produces an reference output signal I-out at node 203. Input stage 202 further includes a first pass transistor 230 connected between node 214 and a pullup node A. A second pass transistor 234 connects between node 216 and a pulldown node B. In the embodiment represented by FIG. 2, output stage 204 includes an inverter 205. Inverter 205 receive the output I-out signal of input stage 202 and produces an output signal OUT at node 206.

Buffer 200 further includes a first variable resistance circuit 240 connected between pullup node A and a supply voltage Vcc and a second variable resistance circuit 242 connected between pulldown node B and ground. Variable resistance circuit 240 includes a first p-channel pullup transistor 244 and a second p-channel pullup transistor 246. Transistors 244 and 246 connect in parallel with each other and in between pullup node A and the supply voltage Vcc. Variable resistance circuit 242 includes a first n-channel pulldown transistor 248 and a second n-channel pulldown transistor 250. Transistor 248 and 250 connect in parallel with each other and in between pulldown node 234 and ground. The gates of transistors 248 and 244 are controlled by first complementary control signal EN and EN*. The gates of transistors 246 and 250 are controlled by second complementary control signal LP and LP*.

In general, in the embodiment represented by FIG. 2, input stage 202 operates as a differential amplifier, which amplifies a difference voltage levels of the reference signal REF and the input signal IN to produce the output signal I-out. Output stage 204 receives the I-out signal and drives it as the OUT signal at node 206. First and second variable resistance circuits 240 and 242 operate as a switching system, which switches input stage 202 between a first and a second conductive path that connect input stage 202 to Vcc and ground. The first conductive path that connects input stage 202 to Vcc and ground includes first pullup transistor 244 and first pulldown transistor 248. The second conductive path that connects input stage 202 to Vcc and ground includes second pullup transistor 246 and second pulldown transistor 250.

As shown in the embodiment represented by FIG. 2, the first conductive path, which includes transistors 244 and 248, is controlled by the EN and EN* signals. The second conductive path, which includes transistors 244 and 248, is controlled by the LP and LP* signals. The EN and EN* signals are activated when input buffer 200 is in an active mode; the LP and LP* signals are activated when buffer 200 is in a low-power or standby mode. Hence, in the active mode, when the EN and EN* are activated and the LP and LP* are not activated, switching system, represented by circuits 240 and 242, connects input stage 202 to Vcc and ground via first conductive path through transistors 244 and 248. In the low-power mode, that is when the EN and EN* are not activated and the LP and LP* are activated in the active mode, the switching system connects input stage 202 to Vcc and ground via the second conductive path through transistors 246 and 250.

In the embodiment represented by FIG. 2, pullup transistor 246 is constructed to have a greater active resistance than that of transistor 244 so that current flowing through an active transistor 246 is less than current flowing through an active transistor 244. For example, transistor 246 can be constructed to have a longer channel (L) or a smaller width (W) or a combination of both in comparison to the channel and width of transistor 244. Similarly, pulldown transistor 250 is constructed to have a greater active resistance than that of pulldown transistor 248 so that current flowing through an active transistor 250 is less than current flowing through an active transistor 248. An active resistance of a transistor is the resistance of the transistor when it is active or turned on. Hence, when first and second variable resistance circuits 240 and 242 connect input stage 202 to Vcc and ground via the second conductive path during the low-power mode (via transistors 246 and 250), the amount of current consumed by input buffer 200 is reduced.

Figure 3:
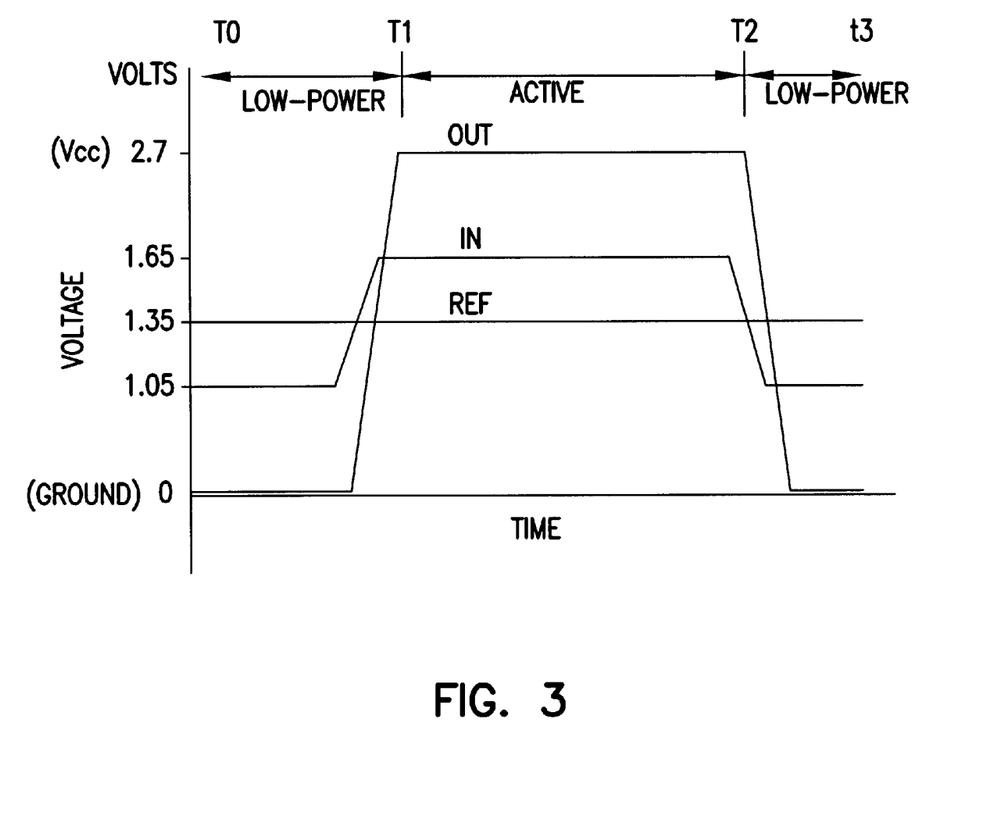
FIG. 3 is a timing diagram showing signal relationship among various signals of the input buffer of FIG. 2.

The detailed operation of input buffer 202 is now described. The operation of input buffer is better understood with a timing diagram of FIG. 3. As shown in FIG. 3, the reference signal REF and the input signal IN follows the Stub Series Terminated Logic (SSTL) signal standard in this embodiment. The input signal IN has high and low signal levels of about 1.65 volts and 1.05 volts. The reference signal REF has a constant level of about 1.35 volts. Vcc is about 2.7 volts. Thus, the voltage level reference signal REF is about one half Vcc or one half or the average of the high and low signal levels of the input signal IN. The active mode is represented in FIG. 3 between times T1 and T2, that is, when the input signal IN is at a high signal level. The low-power or standby mode is represented in FIG. 3 between times T2 and T3 or between times T0 and T1, that is, when the input signal IN is at a low signal level.

As shown in FIG. 3, when the voltage level of the input signal IN is less than the voltage level of the reference signal REF, the level of the output signal OUT is low (LOW). When the voltage level of the input signal IN is greater than the voltage level of the reference signal REF, the level of the output signal OUT is high (HIGH)

Referring to FIG. 2, node A connects to Vcc through either transistor 244 or transistor 246. Node B connects to ground through either transistor 248 or transistor 250. Transistors 244 and 248 are turned on to connect nodes A and B to Vcc and ground when the EN and EN* signals are activated which is when input buffer 200 is in an active mode. Transistors 246 and 250 are turned on to connect nodes A and B to Vcc and ground when the LP and LP* signals are activated which is when input buffer 200 is in a low-power down mode. The EN signal is activated when it is HIGH, the EN* signal is activated when it is LOW. Similarly, The LP signal is activated when it is HIGH, the LP* signal is activated when it is LOW.

When the voltage level of the input signal IN is lower than the voltage level of the reference signal REF, it turns on transistor P2 and turns off transistor N2. Since the voltage level of the IN signal is lower than the voltage level of the REF signal, transistor P2 is on more than transistor P1. Thus, transistor P2 pulls node 203 to a higher voltage than transistor P1 pulling node 220. In other words, current flowing through transistor P2 is greater than current flowing through transistor P1. Since the voltage at node 220 is lower than the voltage at node 203, current flowing through node B is less, which allows transistor P2 to be on more, and quickly pulling node 203 (the I-out signal) to the voltage level of node 214, which is about Vcc. Inverter 205 inverts the I-out signal at node 203 to provide the buffer output signal OUT and drive it to node 206.

When the voltage level of the input signal IN is higher than the voltage level of the reference signal REF, it turns off transistor P2 and turns on transistor N2. Since the voltage level of the IN signal is higher than the voltage level of the REF signal, transistor N2 is on more than transistor N1. Thus, transistor N2 pulls node 203 to a lower voltage than transistor N1 pulling node 220. In other words, current flowing through transistor N2 is more than current flowing through transistor N1. Since the voltage at node 220 is higher than the voltage at node 203, current flowing through node B is more, which allows transistor N2 to be on more, and quickly pulling node 203 (the I-out signal) to the voltage level of node B. Inverter 205 inverts the I-out signal at node 203 to provide the buffer output signal OUT and drive it to node 206.

From the above description, nodes A and B connect to Vcc and ground in both active and the low-power modes. However, nodes A and B connect to Vcc and ground through different conductive paths in each mode. For example, in the active mode, nodes A and B connect to Vcc and ground through one conductive path formed by pullup transistors 244 and pulldown transistor 248. In the low-power mode, nodes A and B connect to Vcc and ground through another conductive path formed by pullup transistors 246 and pulldown transistor 250.

As shown in FIG. 2, pullup transistors 244 and pulldown transistor 248 are controlled by the EN* and EN signals, which are activated only in the active mode; pullup transistors 246 and pulldown transistor 250 are controlled by the LP* and LP signals which are activated only in the low-power mode. Therefore, when the EN and EN* signals are activated during the active mode and the LP and LP* are activated during the low-power modes, variable resistance circuits 240 and 242 also operate a current controller to limit the amount of current consumed by input buffer 200 during the low-power mode.

For example, in the embodiment represented by FIG. 2, during the active mode (transistors 244 and 248 are on, transistors 246 and 250 are off), the current consumed by input buffer could be about 5 milliamperes. However, during the low-power mode (transistors 244 and 248 are off, transistors 246 and 250 are on), the current consumed by input buffer could be about 100 microamperes. Thus, transistors 246 and 250 of variable resistance circuits 240 and 242 acts as current limiters, which limit or reduce the current consumed by input buffer 200 during the low-power mode.

In the detailed description regarding the operation of input buffer 200 represented by FIG. 2, input signal IN is at a low signal level in the active mode and at a high signal level in the low-power mode. However, in other embodiments, the state of the input signal IN can be switched in the active and low-power modes. For example, input signal IN can be at a high signal level in the active mode and at a low signal level in the low-power mode.

In the embodiment of input buffer 200 represented by FIG. 2, input stage 202 operates as a differential amplifier. Therefore, input buffer 202 can be replaced by any differential amplifier. For example, input stage 202 can be replaced by an n-channel differential pair, a p-channel differential pair, or any other differential amplifier known to those skilled in the art.

FIGS. 4–19 are schematic diagrams of variable resistance circuits of an input buffer according to various embodiments of the invention. FIGS. 4–7 shows variable resistance circuits 400, 500, 600 and 700. Each of these circuits can be a substitute for first variable resistance circuit 240 of input buffer 200 shown in FIG. 2. Each of the circuits 400, 500, 600 and 700 connects node A of the input stage, such as node A of input stage 202 of FIG. 2, to a supply voltage Vcc.

Figure 4:
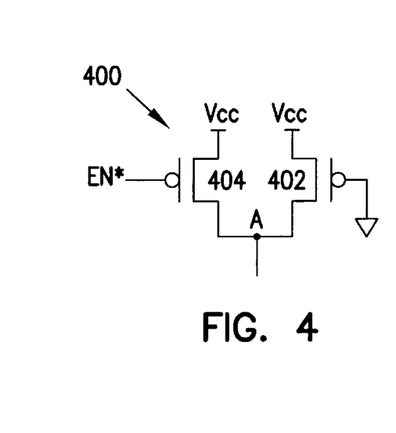
FIGS. 4–15 are schematic diagrams of variable resistance circuits of an input buffer according to various embodiments of the invention.

In FIG. 4, circuit 400 is similar to circuit 240 of FIG. 2 except that transistor 402 has its gate connected to ground. Transistor 402 is constructed such that its active resistance is greater than the active resistance of transistor 404 so that current flowing through transistor 402 is less than current flowing through transistor 404. In one embodiment, in the active mode, the current flowing through transistor 404 could be 100 microamperes and the current flowing through transistor 402 could be 5 milliamperes. Therefore, in the active mode the current flowing through transistor 404 is insignificant in comparison to the total current consumed by the input buffer. However, in the low-power mode (the EN* signal is deactivated and transistor 404 is off), the current consumed the input buffer is about the same as the current passing through transistor 402 (about 100 microamperes) which is significantly less than the current passing through both transistors 402 and 404 in the active mode.

The values of current in the above example such as 100 microamperes and 5 milliamperes, and other numerical values disclosed throughout this specification, are only used;to for ease of illustrating the invention. These value are not absolute and are not intended to limit the scope of the invention.

Figure 5:
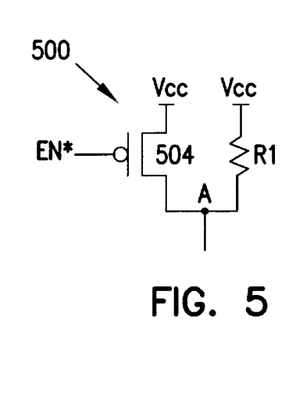

In FIG. 5, circuit 500 is constructed similarly to circuit 400 except that one of the transistors is replaced by a resistor R1. In the same concept as circuit 400, resistor R1 is constructed such that its resistance is greater than an active resistance of transistor 504 to allow a substantially small amount of current flowing through the resistor. Thus, in the low-power mode (the EN* is deactivated), when transistor 504 is off, the current consumed by the input buffer is about the same as the current passing through resistor R1, which significantly less significantly less than the current passing through both transistor 504 and resistor R1 in the active mode.

Figure 6:
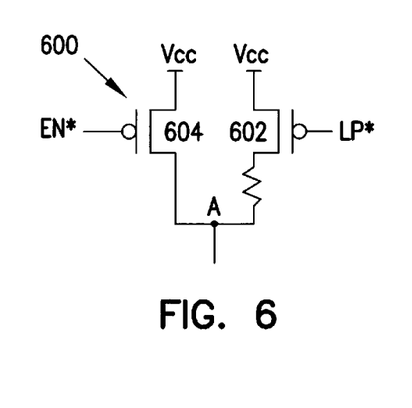
Figure 7:
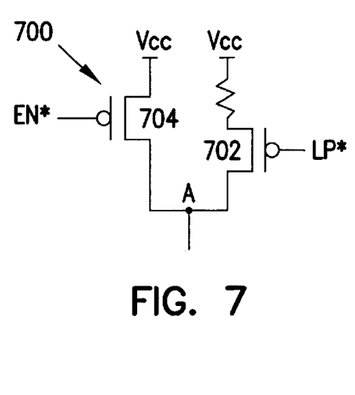

In FIGS. 6 and 7, circuit 600 and 700 are similar to circuit 242 of FIG. 2 except that a resistor R1 is added and is connected in series with transistor 602 or 702 between Vcc and the input stage. Similar to circuit 500 of FIG. 5, resistor R1 in circuit 600 is constructed such that its resistance is greater than an active resistance of transistor 602. Resistor R1 in circuit 700 is constructed such that its resistance is greater than an active resistance of transistor 702. In the embodiment represented by FIGS. 6 and 7, transistors 602 and 604, and transistors 702 and 704 are constructed the same because resistor R1 acts as current limiter in the low-power mode. In other embodiments, however, transistors 602 and 702 can be constructed different than transistors 604 and 704 provided that the active resistance of transistor 602 or transistor 702 combines with the resistance of resistor R1 is greater than the active resistance of transistor 604 or transistor 704.

Figure 8:
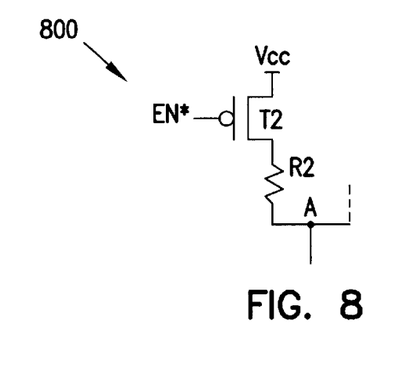
Figure 9:
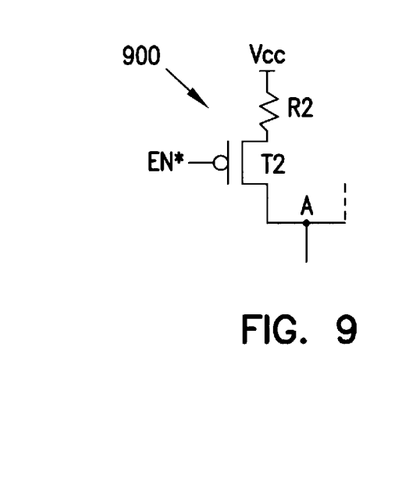
Figure 10:
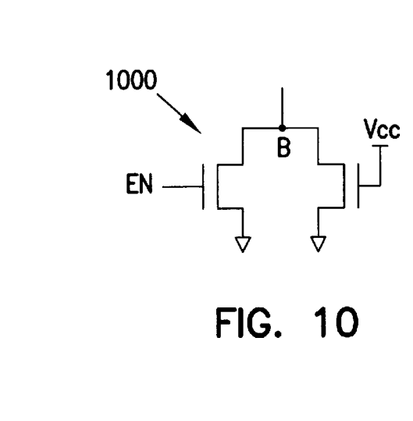
Figure 11:
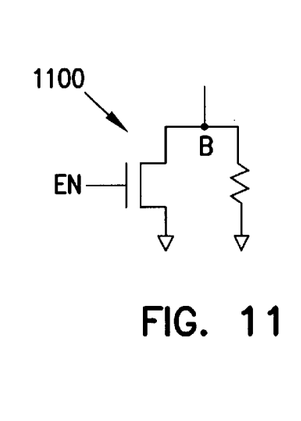
Figure 12:
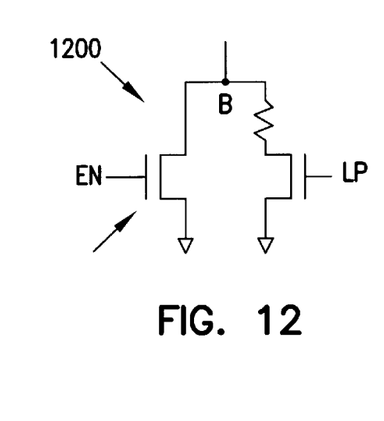
Figure 13:
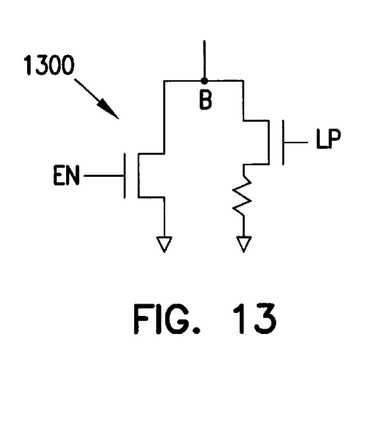

FIGS. 8–9 are schematic diagrams of portions of variable resistance circuits of an input buffer according to other embodiments of the invention. Each of the circuits 800 and 900 shown in FIG. 8–9 can be a substitute for the left path from node A to Vcc of circuits shown in FIGS. 4–7. In other words, each of the circuits 800 and 900 shown in FIG. 8–9 can be a substitute for transistors 404, 504, 604 and 704 of FIGS. 4–7. The active resistance of both transistor T2 and resistor R2 of circuit 800 or 900 is less than the active resistance of R1 or transistors 402, 602 or 702. This ensures that the current in the low-power mode through transistor T2 and R2 is substantially less the current in the active mode through transistor 402 or resistor R1.

FIGS. 10–13 are schematic variable resistance circuits 1000, 1100, 1200 and 1300. Each of these circuits can be a substitute for second variable resistance circuit 242 of input buffer 200 shown in FIG. 2. The circuits shown in FIGS. 10–13 are arranged in a similar arrangement as the circuits shown in FIGS. 4–7. In FIGS. 10–13, each of the circuits 1000, 1100, 1200 and 1300 connects node B of the input stage, such as node B of input stage 202 of FIG. 2, to ground. The functions of the circuits shown in FIGS. 10–13 are similar to the functions of the circuits shown in FIGS. 4–7 which is to reduce the current in the low-power mode by switching to the conductive path that has greater resistance than the resistance of the conductive path used in the active mode.

Figure 14:
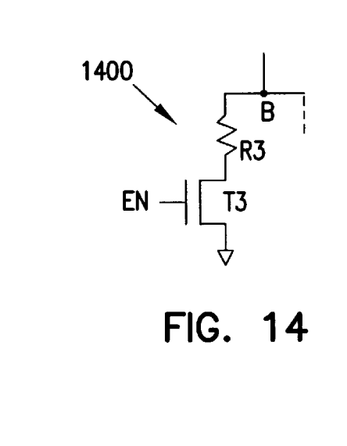
Figure 15:
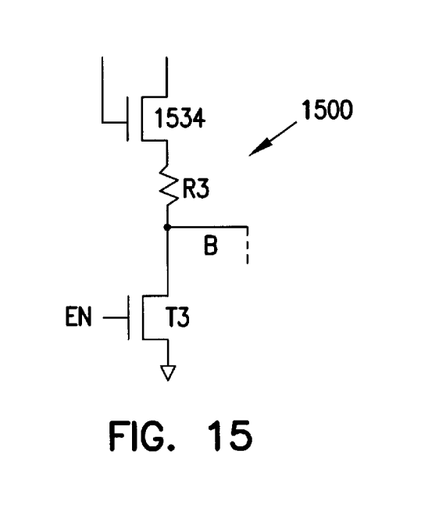

FIGS. 14–15 are schematic diagrams of portions of variable resistance circuits of an input buffer according to other embodiments of the invention. In FIG. 14, circuit 1400 can be a substitute for the left path from node B to ground of the circuits shown in FIGS. 10–13. The active resistance of both transistor T3 and resistor R3 of circuit 1400 is less than the active resistance of the right conductive path of the circuits shown in FIGS. 10–13. In FIG. 15, transistor 1534 is represented in FIG. 2 as transistor 234. With the addition of resistor R3, circuit 1500 of FIG. 15 can also be a substitute for the circuits shown in FIG. 10–13.

In the embodiments represented by the circuits shown in FIGS. 4–15, in the active mode, the EN and EN* signals are activated and the LP and LP* signals are deactivated. Thus, in the active mode, the transistors which are controlled by the EN and EN* signals are active or turned on and the transistors which are controlled by the LP and LP* signals are not active or turned off. In the low-power mode, the EN and EN* signals are deactivated and the LP and LP* signals are activated. Thus, in the low-power mode, the transistors which are controlled by the EN and EN* signals are not active or turned off and the transistors which are controlled by the LP and LP* signals are active or turned on.

According to the invention, each of the circuits shown in FIGS. 4–9 can be a substitute for circuit 240 of FIG. 2; and each of the circuits shown in FIGS. 10–15 can be a substitute for circuit 242 of FIG. 2. In addition, any one of the circuits shown in FIG. 4–9 can also be combined with any one of the circuits shown in FIGS. 10–15 to form a combination to substitute for circuits 240 and 242 of FIG. 2 and still achieve the same purpose of the invention as described in this specification.

Figure 16:
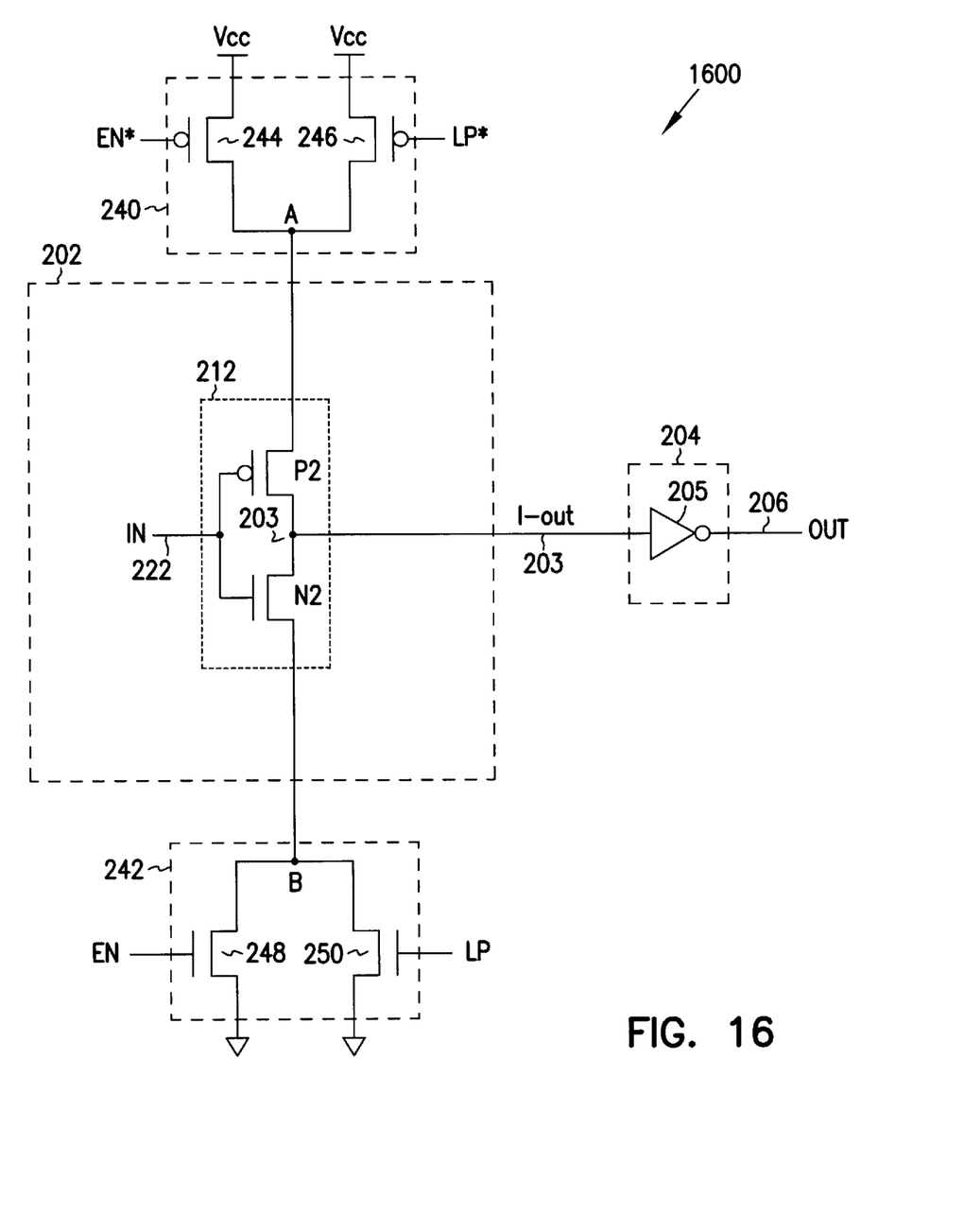
FIG. 16 is a schematic diagram of an input buffer according to another embodiment of the invention.

FIG. 16 is a schematic diagram of an input buffer 1600 according to another embodiment of the invention. Input buffer 1600 is similar to input buffer 200 shown in FIG. 2. Therefore, circuit elements that are the same in both input buffers have the same reference numbers. One difference between input buffers 200 and 1600 is input stage 202. In FIG. 16, input buffer 1600 includes only transistor pair 212 connected between node A and B and acts as an inverter. However, input buffer 1600 has similar characteristics as that of input buffer 200, that is, it consumes less current during the low-power mode than during the active mode.

In the embodiment represented by FIG. 16, similar to input buffer 200, nodes A and B of input buffer 1600 connect to Vcc and ground through either a first or a second conductive path. The first conductive path is formed by transistors 244 and 248 during the active mode, in which the EN and EN* signals are activated and the LP and LP* signals are not activated. The second conductive path is formed by transistors 246 and 250 during the low-power mode, in which the LP and LP* signals are activated and the EN and EN* signals are not activated.

Similar to input buffer 200, the active resistance of transistor 246 is greater than the active resistance of transistor 244; the active resistance of transistor 250 is greater than the active resistance of transistor 248. In the active mode, transistors 244 and 248 are active (on) and transistors 246 and 250 are not active (off). In the low-power mode, transistors 246 and 250 are active (on) and transistors 244 and 248 are not active (off). Therefore, input buffer 1600 consumes less current in the low-power mode than in the active mode.

In FIG. 16, variable resistance circuit 240 can be replaced with any one of the circuits shown in FIGS. 4–9. Variable resistance circuit 242 can be replaced with any one of the circuits shown in FIGS. 10–15. Further, both variable resistance circuits 240 and 242 can also be replaced by combination of any one of the circuits shown in FIGS. 4–9 and any one of the circuits shown in FIGS. 10–15.

Figure 17:
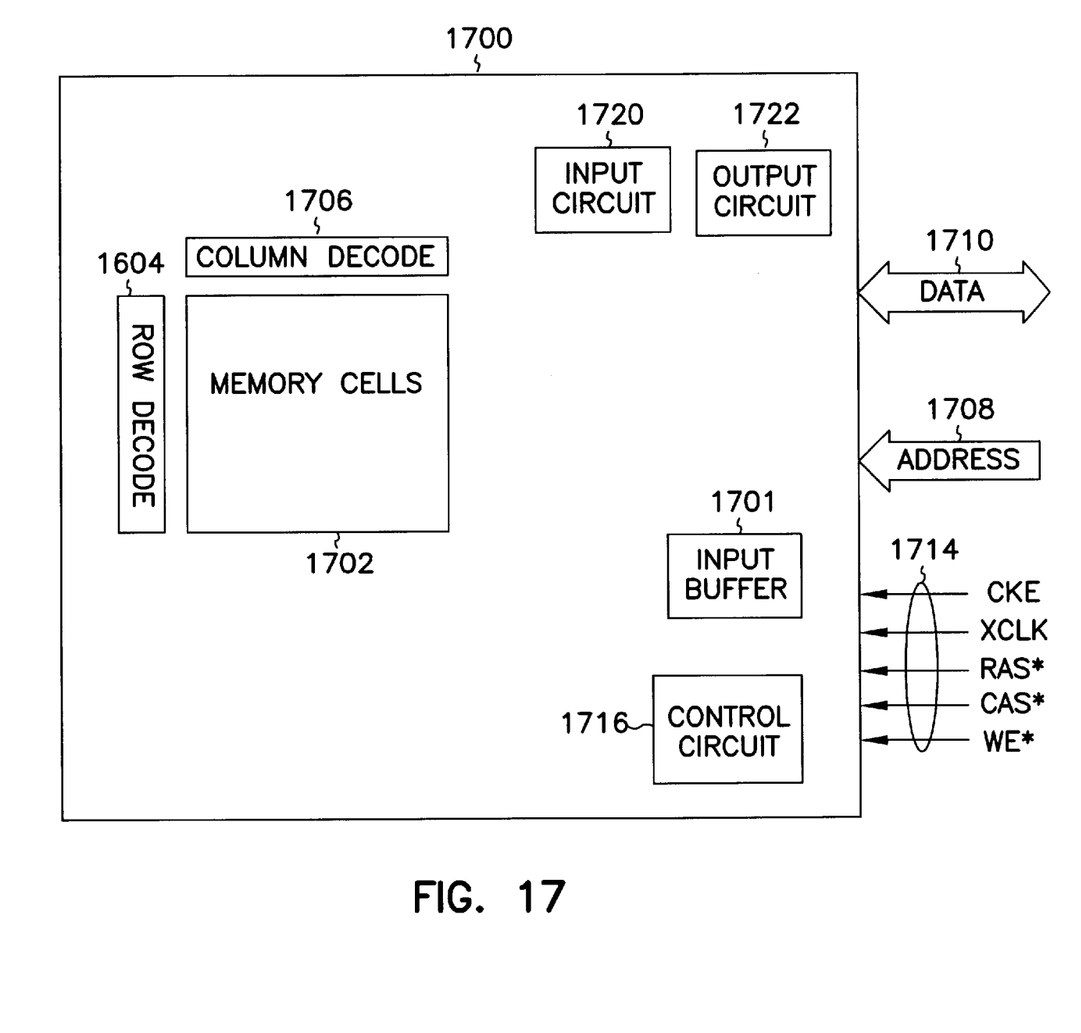
FIG. 17 is a block diagram of a memory device according to one embodiment of the invention.

FIG. 17 is a block diagram of a memory device 1700 according to embodiment of the invention. Memory device 1700 includes a plurality of memory cells 1702 arranged in rows and columns. Row decode circuit 1704 and column decode circuit 1706 access the rows and columns in response to an address, provided on a plurality of address lines or bus 1708. Data is transferred to and from memory device 1700 through data lines or bus 1710. A control circuit 1716 controls data communication to and from memory device 1700, via input circuit 1720 and output circuit 1722 in response to input signals on control lines 1714. Control circuit 1716 receives the input signals on lines 1714 to determine operating modes of memory device 1700 such as a read, write, refresh, power-mode or standby modes. The input signals on lines 1714 include, but are not limited to, External Clock (XCLK), Clock Enable (CKE), Row Access Strobe (RAS*), Column Access Strobe (CAS*), and Write Enable (WE*). Memory device 1700 also includes at least one input buffer 1701.

Those of ordinary skill in the art will readily recognize that memory device 1700 of FIG. 17 is simplified to illustrate one embodiment of a memory device of the present invention and is not intended to be a detailed description of all of the features of a memory device. Further, operation of an active mode of memory device such as a read or write mode and operation of a low-power (standby) mode or a self-refresh mode are similar to that of a conventional memory device known to those skilled in the art. Therefore, detailed description of the active mode or the low-power mode are not described in this specification.

In the embodiment represented by FIG. 17, input buffer 1701 is similar to input buffer 200 represented by FIG. 2 or input buffer 1600 of represented by FIG. 16. In FIG. 17, input buffer receives the CKE signal to generate a buffer output signal. The CKE signal in FIG. 17 is represented in FIG. 2 as the input signal IN. According to the invention, input buffer 1701 operates in a fashion such that in the low-power mode or the self-refresh mode, the current consumed by input buffer 1701 is substantially less than the current consumed by input buffer 1701 during the active mode such as a read or write mode.

Memory device 1700 of FIG. 17 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs.

Figure 18:
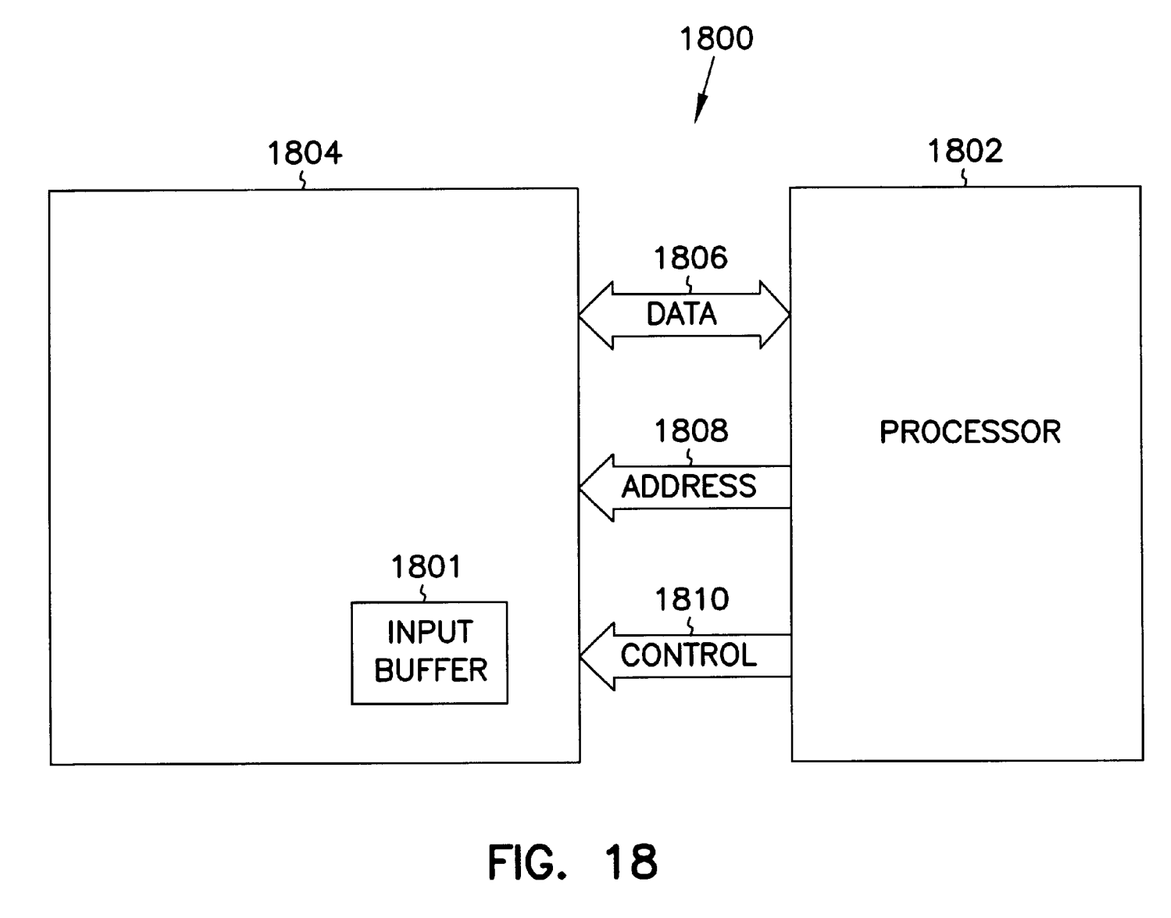
FIG. 18 is a block diagram of a system including an input buffer according to one embodiment of the invention.

FIG. 18 shows a system 1800 according to one embodiment of the invention. System 1800 includes a processor 1802 and a memory device 1804. Memory device 1804 represents memory device 1700 shown in FIG. 17. Processor 1802 can be a microprocessor, digital signal processor, embedded processor, microcontroller, or the like. Processor 1802 and memory device 1804 communicate using address signals on lines 1808, control signals on lines 1810, and data signals on lines 1806.

Memory device 1804 includes an input buffer 1801. Input buffer 1801 is similar to input buffers 200, 1600, and 1601. In the embodiment represented by FIG. 18, processor provides control to memory 1804 via control signals on lines 1810. The control signals on lines 1810 similar to the control signals represented in FIG. 17 as the XCLK, CKE, RAS*, CAS*, and WE* signals. Based on the control signals, operating mode such as active mode or low-power mode of memory device 1804 is determined. According to the invention, input buffer 1801 operates fashion such that in the low-power mode or the refresh mode, the current consumed by input buffer 401 is substantially less than the current consumed by input differential buffer 1801 during the active mode such as a read or write mode.

As represented by FIG. 17, an input buffer such as input buffer 200, 1600, or 1601 is incorporated into memory device 1700 for use as an input buffer to receive an external input signal, such as the CKE signal. The input buffers as represented by input buffers 200, 1600, and 1601 according to the invention, however, are not limited for use only in memory devices. For example, input buffer 200, 1600, or 1601 can be incorporated into a processor, such as processor 1802, a memory controller, an application specific integrated circuit (ASCI). In general, any one of the input buffers according to the invention can be incorporated into any integrated circuit or device for use as an input buffer to receive an input signal.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A buffer comprising:
   an input stage including an input node to receive an input signal to produce an output signal, another input node to receive a reference signal, the input stage being connected to a supply voltage;
   a variable resistance system connected between the input stage and the supply voltage, and responsive to a mode signal for reducing an amount of current flowing through the input stage during a low-power mode; and
   an output stage connected to the input stage to receive and drive the output signal.

2. The buffer of claim 1, wherein the variable resistance system includes:
   an active mode transistor connected between the input stage and the supply voltage; and
   a current limiter connected in parallel with the transistor and in between the input stage and the supply voltage.

3. The buffer of claim 2, wherein an active resistance of the current limiter is greater than an active resistance of the active mode transistor.

4. The buffer of claim 2, wherein the current limiter includes a transistor, the transistor having an active resistance greater than that of the active mode transistor.

5. The buffer of claim 2, wherein the current limiter includes a resistor, the resistor having a resistance greater than that of the active mode transistor.

6. The buffer of claim 2, wherein the current limiter includes a resistor connected in series with a transistor, the resistor having a resistance greater than that of the active mode transistor.

7. A buffer comprising:
   an input stage including an input node to receive an input signal to produce an output signal, the input stage being connected to a supply voltage; and
   a variable resistance system connected between the input stage and the supply voltage, and responsive to a mode signal for reducing an amount of current flowing through the input stage during a low-power mode, wherein the input stage further includes another input node to receive a reference signal.

8. The buffer of claim 7, wherein the variable resistance system includes:
   an active mode transistor connected between the input stage and the supply voltage; and
   a current limiter connected in parallel with the transistor and in between the input stage and the supply voltage.

9. The buffer of claim 8, wherein an active resistance of the current limiter is greater than an active resistance of the active mode transistor.

10. The buffer of claim 8, wherein the current limiter includes a transistor, the transistor having an active resistance greater than that of the active mode transistor.

11. The buffer of claim 8, wherein the current limiter includes a resistor, the resistor having a resistance greater than that of the active mode transistor.

12. The buffer of claim 8, wherein the current limiter includes a resistor connected in series with a transistor, the resistor having a resistance greater than that of the active mode transistor.

13. A buffer comprising:
   an input stage including an input node to receive an input signal to produce an output signal, the input stage being connected to a supply voltage;
   a variable resistance system connected between the input stage and the supply voltage, and responsive to a mode signal for reducing an amount of current flowing through the input stage during a low-power mode; and
   an output stage connected to the input stage to receive and drive the output signal.

14. The buffer of claim 13, wherein the variable resistance system includes:
   an active mode transistor connected between the input stage and the supply voltage; and
   a current limiter connected in parallel with the transistor and in between the input stage and the supply voltage.

15. The buffer of claim 14, wherein an active resistance of the current limiter is greater than an active resistance of the active mode transistor.

16. The buffer of claim 14, wherein the current limiter includes a transistor, the transistor having an active resistance greater than that of the active mode transistor.

17. The buffer of claim 14, wherein the current limiter includes a resistor, the resistor having a resistance greater than that of the active mode transistor.

18. The buffer of claim 14, wherein the current limiter includes a resistor connected in series with a transistor, the resistor having a resistance greater than that of the active mode transistor.

19. A buffer comprising:
an input stage including an input node to receive an input signal and an output node to produce an output signal;
an output stage connected to the input stage to receive and drive the output signal; and
a switching system to connect the input stage to a supply voltage and ground via a first conductive path during a first operating mode and to connect the input stage to the supply voltage and ground via a second conductive path during a second operating mode.

20. The buffer of claim 19, wherein the input stage further includes another input node to receive a reference signal.

21. The buffer of claim 19, wherein the switching system includes:
a first transistor connected between the input stage and the supply voltage; and
a second transistor connected between the input stage and ground, the first and second transistor forming the first conductive path connecting the input stage to the supply voltage and ground during the first mode.

22. The buffer of claim 21, wherein the switching system further includes:
a first current limiter connected between the input stage and the supply voltage; and
a second current limiter connected between the input stage and ground, the first and second current limiters forming the second conductive path connecting the input stage to the supply voltage and ground during the second mode.

23. The buffer of claim 22, wherein an active resistance of the first current limiter is greater than an active resistance of the first transistor.

24. The buffer of claim 22, wherein an active resistance of the second current limiter is greater than an active resistance of the second transistor.

25. A buffer comprising:
an input stage including an input to receive an input signal and an output to produce an output signal;
an output stage connected to the input stage to receive and drive the output signal;
a first conductive path to connect the input stage to a supply voltage and ground during a first operating mode; and
a second conductive path to connect the input stage to a supply voltage and ground during a second operating mode.

26. The buffer of claim 25, wherein the input stage further includes another input node to receive a reference signal.

27. The buffer of claim 25, wherein an active resistance of the first conductive path is greater than an active resistance of the second conductive path.

28. The buffer of claim 25, wherein the first conductive paths includes:

a first current limiter connected between the input stage and the supply voltage; and
a second current limiter connected between the input stage and ground.

29. The buffer of claim 25, wherein the second conductive paths includes:
a first transistor connected between the input stage and the supply voltage; and
a second transistor connected between the input stage and ground.

30. The buffer of claim 25, wherein the current limiter includes a transistor.

31. The buffer of claim 30, wherein the current limiter further includes a resistor connected in series with the transistor.

32. A buffer comprising:
an input stage to receive an input signal and a reference signal to produce an output signal;
an output stage connected to the input stage to receive and drive the output signal;
a first variable resistance circuit connected between the input stage and a first supply potential to vary a resistance of a conductive path connected between the input stage and the first supply potential; and
a second variable resistance circuit connected between the input stage and a second supply potential to vary a resistance of a conductive path connected between the input stage and the second supply potential.

33. The buffer of claim 32, wherein the first variable resistance circuit includes:
a first transistor connected between the input stage and the first supply potential; and
a first current limiter connected between the input stage and the first supply potential.

34. The buffer of claim 33, wherein the second variable resistance circuit includes:
a second transistor connected between the input stage and the second supply potential; and
a second current limiter connected between the input stage and the second supply potential.

35. The buffer of claim 33, wherein an active resistance of the first current limiter is greater than an active resistance of the first transistor.

36. The buffer of claim 34, wherein an active resistance of the second current limiter is greater than an active resistance of the second transistor.

37. The buffer of claim 33, wherein the first current limiter includes a long channel transistor.

38. The buffer of claim 37, wherein the first current limiter further includes a resistor connected in series with the long channel transistor.

39. The buffer of claim 33, wherein the first current limiter includes a resistor.

40. A buffer comprising:
an input stage to receive an input signal and a reference signal to produce an output signal;
an output stage connected to the input stage to receive and drive the output signal;
a first current controller connected between the input stage and a first supply potential to vary an amount of current flowing between the input stage and the first supply potential; and
a second current controller connected between the input stage and a second supply potential :to vary an amount of current flowing between the input stage and the second supply potential.

41. The buffer of claim 40, wherein the first current controller includes:
   a first transistor connected between the input stage and the first supply potential; and
   a first current limiter connected between the input stage and the first supply potential.

42. The buffer of claim 41, wherein the second variable resistance circuit includes:
   a second transistor connected between the input stage and the second supply potential; and
   a second current limiter connected between the input stage and the second supply potential.

43. The buffer of claim 42, wherein the second current controller further includes a resistor connected in series with the second transistor.

44. The buffer of claim 41, wherein an active resistance of the first current limiter is greater than an active resistance of the first transistor.

45. The buffer of claim 42, wherein an active resistance of the second current limiter is greater than an active resistance of the second transistor.

46. A buffer comprising:
   a first CMOS transistor pair to receive a reference signal to produce a reference output signal;
   a second CMOS transistor pair connected to the first CMOS transistor pair at a first node and a second node, the second CMOS transistor pair being connected to an input node to receive an input signal to produce an output signal at an output node;
   a first pass transistor connected between the first node and a pullup node;
   a second pass transistor connected between the second node and a pulldown node;
   a first pullup transistor connected between the pullup node and a supply voltage;
   a second pullup transistor connected between the pullup node and the supply voltage;
   a first pulldown transistor connected between the pulldown node and ground; and
   a second pulldown transistor connected the between the pulldown node and the supply voltage.

47. The buffer of claim 46, further comprising an inverter connected to the second CMOS transistor pair to receive and drive the output signal.

48. The buffer of claim 46, wherein the first and second pass transistors include control gates, the control gates being controlled by the reference output signal.

49. The buffer of claim 46, wherein an active resistance of the first pullup transistor is greater than an active resistance of the second pullup transistor.

50. The buffer of claim 46, wherein an active resistance of the first pulldown transistor is greater than an active resistance of the second pulldown transistor.

51. The buffer of claim 46, wherein the first pullup and pulldown transistors include control gates, the control gates being controlled by first complementary control signals, wherein the first complementary control signals are activated when the input signal is activated.

52. The buffer of claim 51, wherein the second pullup and pulldown transistors include control gates, the control gates being controlled by second complementary control signals, wherein the second complementary control signals are activated when the input signal is deactivated.

53. An integrated circuit comprising:
   a control circuit to receive an input signal to generate a first enable signal during a first operating mode and a second enable signal during a second operating mode;
   a reference generator to generate a reference signal; and
   a buffer connected to the control circuit and the reference generator, the buffer including:
      an input stage to receive the input signal and a reference signal to produce an output signal;
      an output stage connected to the input stage to receive and drive the output signal; and
      a switching system to connect the input stage to a supply voltage and ground via a first conductive path in response to the first enable signal, and to connect the input stage to the supply voltage and ground via a second conductive path in response to the second enable.

54. The integrated circuit of claim 53, wherein the switching system includes:
   a first transistor connected between the input stage and the supply voltage; and
   a second transistor connected between the input stage and ground, the first and second transistor forming the first conductive path connecting the input stage to the supply voltage and ground during the first mode.

55. The integrated circuit of claim 54, wherein the switching system further includes:
   a first current limiter connected between the input stage and the supply voltage; and
   a second current limiter connected between the input stage and ground, the first and second current limiters forming the second conductive path connecting the input stage to the supply voltage and ground during the second mode.

56. The integrated circuit of claim 55, wherein an active resistance of the first current limiter is greater than an active resistance of the first transistor.

57. The integrated circuit of claim 55, wherein an active resistance of the second current limiter is greater than an active resistance of the second transistor.

58. A memory device comprising:
   a control circuit to receive an input signal to generate a first enable signal during an active mode of the memory device and to generate a second enable signal during a low-power mode of the memory device;
   a plurality of memory cells to be accessed in a read or a write operation during the memory active mode;
   a reference generator to generate a reference signal; and
   a buffer connected to the control circuit and the reference generator, the buffer including:
      an input stage to receive the input signal and a reference signal to produce an output signal;
      an output stage connected to the input stage to receive and drive the output signal such that the control circuit activates the read or write mode to access the memory cells based on the state of output signal; and
      a switching system to connect the input stage to a supply voltage and ground via a first conductive path in response to the first enable signal, and to connect the input stage to the supply voltage and ground via a second conductive path in response to the second enable signal.

59. The memory device of claim 58, wherein an active resistance of the first conductive path is greater than an active resistance of the second conductive path.

60. The memory device of claim 58, wherein the first and second conductive paths are constructed such that a current flowing in the first conductive path during the low-power mode is less than a current flow in the second conductive path during the active mode.

61. A system comprising:
   a processor; and
   a memory device connected to the processor, the memory device comprising:
      a control circuit to receive an input signal to generate a first enable signal during an active mode of the memory device and to generate a second enable signal during a low-power mode of the memory device;
      a plurality of memory cells to be accessed in a read or a write operation during the memory active mode;
      a reference generator to generate a reference signal; and
      a buffer connected to the control circuit and the reference, the buffer including:
         an input stage to receive the input signal and a reference signal to produce an output signal;
         an output stage connected to the input stage to receive and drive the output signal such that the control circuit activates the read or write mode to access the memory cells based on the state of output signal; and
         a switching system to connect the input stage to a supply voltage and ground via a first conductive path in response to the first enable signal, and to connect the input stage to the supply voltage and ground via a second conductive path in response to the second enable signal.

62. The system of claim 61, wherein an active resistance of the first conductive path is greater than an active resistance of the second conductive path.

63. The system of claim 61, wherein the first and second conductive paths are constructed such that a current flowing in the first conductive path during the low-power mode is less than a current flow in the second conductive path during the active mode.

64. A method of forming a buffer, the method comprising:
   forming a first stage of the buffer to receive a reference signal and an input signal to provide an output signal;
   forming an output stage to receive the output signal and drive the output signal;
   forming a first conductive path connecting the input stage to a supply voltage and ground; and
   forming a second conductive path connecting the input stage to a supply voltage and ground.

65. The method of claim 64, forming a first conductive path includes:
   forming a first transistor connecting the input stage to the supply voltage; and
   forming a second transistor connecting the input stage to ground.

66. The method of claim 64, forming a second conductive path includes:
   forming a first current limiter in parallel with the first transistor and in between the input stage and supply voltage; and
   forming a second current limiter in parallel with the second transistor and in between the input stage and ground.

67. The method of claim 66, wherein forming a first current limiter includes forming a transistor.

68. The method of claim 66, wherein forming a first current limiter includes forming a resistor.

69. The method of claim 68, wherein forming a first current limiter further includes forming a resistor in series with the transistor.

70. A method of operating a buffer, the method comprising:
   receiving a reference signal at an input of a differential amplifier;
   receiving an input signal at another input of the differential amplifier;
   switching a current path of the differential amplifier to a first conductive path based on a relationship of between the reference and input signals in one operating mode of the buffer; and
   switching the current path of the differential amplifier to a second conductive path based on the relationship between the reference and input signals in another operating mode of the buffer.

71. The method of claim 70, wherein switching a current path of the differential amplifier to a first conductive path occurs in an active mode.

72. The method of claim 70, wherein switching the current path of the differential amplifier to a second conductive path occurs in a low-power mode.

73. A method of reducing current in a buffer, the method comprising:
   receiving an input signal at an input stage;
   varying a resistance of a conductive path that connects the input stage to a supply voltage and ground between an active mode and a low-power mode; and
   receiving a reference signal at the input stage.

74. A method of reducing current in a buffer, the method comprising:
   receiving an input signal at an input stage;
   varying a resistance of a conductive path that connects the input stage to a supply voltage and ground between an active mode and a low-power mode;
   receiving a reference signal at the input stage; and
   varying a resistance includes increasing the resistance of the conductive path that connects the differential amplifier to a supply voltage and ground during the low-power mode.

* * * * *

UNITED STATES PATENT AND TRADEMARK OFFICE
CERTIFICATE OF CORRECTION

PATENT NO.    : 6,552,596 B2
DATED         : April 22, 2003
INVENTOR(S)   : Victor Wong and Timothy B. Cowles It is certified that error appears in the above-identified patent and that said Letters Patent is hereby corrected as shown below:

Column 3,
Lines 18 and 20, delete "a" after "and".
Lines 19 and 20, delete "an" after "produces" and insert -- a -- therefor.

Column 6,
Line 34, delete "used;to" and insert -- used -- therefor.
Line 34, delete "value" and insert -- values -- therefor.
Line 45, delete second instance of "significantly less".

Column 7,
Line 10, insert -- than -- after "less".

Column 8,
Line 63, delete "of" after "1600".

Column 12,
Line 67, delete ":" after "potential".

Column 13,
Line 44, delete "the" after "connected".

Signed and Sealed this

Ninth Day of September, 2003

JAMES E. ROGAN
*Director of the United States Patent and Trademark Office*